United States Patent
Liu et al.

(10) Patent No.: US 7,695,994 B2
(45) Date of Patent: Apr. 13, 2010

(54) MATERIAL SIDEWALL DEPOSITION METHOD

(75) Inventors: Jun Liu, Boise, ID (US); Keith Hampton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 216 days.

(21) Appl. No.: 11/739,172

(22) Filed: Apr. 24, 2007

(65) Prior Publication Data

US 2008/0268568 A1    Oct. 30, 2008

(51) Int. Cl.
*H01L 21/00* (2006.01)
(52) U.S. Cl. ............... 438/54; 438/48; 438/95; 438/210; 438/238; 438/382; 257/2; 257/3; 257/774; 257/E21.585
(58) Field of Classification Search .......... 257/E45.002, 257/2, 3, E21.585; 365/163; 438/48, 54, 438/95, 210, 238, 382
See application file for complete search history.

(56) References Cited

U.S. PATENT DOCUMENTS

| 5,687,112 A | * | 11/1997 | Ovshinsky | 365/163 |
| 6,117,720 A | * | 9/2000 | Harshfield | 438/238 |
| 2006/0040485 A1 | * | 2/2006 | Lee et al. | 438/597 |
| 2006/0043355 A1 | * | 3/2006 | Ryoo et al. | 257/2 |

* cited by examiner

*Primary Examiner*—Charles D Garber
*Assistant Examiner*—Yasser A Abdelaziez
(74) *Attorney, Agent, or Firm*—Dickstein Shapiro LLP

(57) ABSTRACT

A method of forming a layer of material on a sidewall of a via with good thickness control. The method involves forming a layer of material with a conventional deposition process. The material formed on a field region surrounding the via is removed with a sputter etch process. Another layer of material is deposited thereon, wherein the sputter etch-deposition cycle is repeated as necessary to achieve a desired sidewall thickness. With this method, the thickness of the material deposited on the sidewall is linearly dependent on the number of process cycles, thus providing good thickness control. The method may be used to form a resistance variable material, e.g., a phase-change material, on a via sidewall for use in a memory element.

43 Claims, 18 Drawing Sheets

MATERIAL SIDEWALL DEPOSITION METHOD

FIELD OF THE INVENTION

Embodiments of the invention relate to the field of semiconductor devices. In particular, they relate to a method of forming a material layer along sidewalls of a semiconductor structure.

BACKGROUND OF THE INVENTION

Non-volatile memory elements are desirable elements of integrated circuits due to their ability to maintain data absent a supply of power. Various resistance variable materials have been investigated for use in non-volatile memory elements, including chalcogenide alloys, which are capable of stably transitioning between amorphous and crystalline phases. Each phase exhibits a particular resistance state and the resistance states can be used to distinguish the logic values of the memory element. Specifically, an amorphous state exhibits a relatively high resistance, while a crystalline state exhibits a relatively low resistance.

Phase-change memory elements are disclosed in pending U.S. patent application Ser. No. 11/396,616, entitled PHASE CHANGE MEMORY ELEMENTS USING SELF-ALIGNED PHASE CHANGE MATERIAL LAYERS AND METHODS OF MAKING AND USING THE SAME, filed on Apr. 4, 2006 ("the '616 application"), which is incorporated herein in its entirety by reference. One such phase-change memory element 110, illustrated in FIGS. 1A and 1B, has a layer of phase-change material 116 between first and second electrodes 112, 118, which are supported by a dielectric material 114 which has an opening containing the first electrode 112. The phase-change material 116 is set to a particular resistance state according to the amount of current applied by the first and second electrodes 112, 118. To obtain an amorphous state (FIG. 1B), a relatively high write current pulse (a reset pulse) is applied through the conventional phase-change memory element 110 to melt at least a portion 126 of the phase-change material 116 covering the first electrode 112 for a first period of time. The current is removed and the phase-change material 116 cools rapidly to a temperature below the crystallization temperature, which results in the portion 126 of the phase-change material 116 covering the first electrode 112 having the amorphous state. To obtain a crystalline state (FIG. 1A), a lower write current pulse (a set pulse) is applied to the phase-change memory element 110 for a second period of time, which is typically longer in duration than the crystallization time of amorphous phase-change material, to heat the amorphous portion 126 of the phase-change material 116 to a temperature below its melting point, but above its crystallization temperature. This causes the amorphous portion 126 of the phase-change material 116 to re-crystallize to the crystalline state that is maintained once the current is removed and the phase-change memory element 110 is cooled. The phase-change memory element 110 is read by applying a read voltage, which does not change the state of the phase-change material 116.

One potential drawback of the above described phase-change memory element 110 is the large programming current needed to achieve the phase change. This need for the large current is a limitation when attempting to reduce the size of the memory element. Another problem associated with the above described phase-change memory element 110 is heat loss. Since the phase-change material 116 is in direct contact with a large area of the first electrode 112, there may be a significant amount of heat loss resulting in a large reset current requirement. Additionally, since the programmable volume (i.e., portion 126) of the phase-change material 116 is not confined and has the freedom to extend sideways during phase change, switching stability may be reduced.

Accordingly, one technique used to reduce the high current requirement, reduce heat loss, and improve switching stability has been to confine and reduce the programmable volume and reduce the electrode area in contact with the programmable volume. FIG. 2A, also described in the '616 application, illustrates one example of a phase-change memory element 210 designed to address the potential drawbacks of the phase-change memory element 110 illustrated in FIGS. 1A-1B. To fabricate the phase-change memory element 210, as shown in FIG. 2B, a cylindrical via 222 is etched into a second insulating layer 224 to expose a first electrode 212. A layer of phase-change material 216 (FIG. 2C) is deposited along the sidewall 230 of the via 222 to serve as the programmable volume of the phase-change memory element 210. In FIG. 2C, a third insulating layer 228 is deposited over the phase-change material 216 and within the via 222. A subsequent chemical-mechanical planarization (CMP) step removes the phase-change material 216 and the insulating material 228, stopping at the second insulating layer 224. The CMP process exposes a ring 232 of phase-change material 216 which can be covered by and in contact with the second electrode 218 as shown in FIG. 2A.

Referring to FIG. 3, it is known that due to arrival angle distribution and poor step coverage, a conventional physical vapor deposition (PVD) process can not always accurately control the thickness of the phase-change material 316 deposited along the sidewall 330 of a via 322. In addition, a maximum thickness of phase-change material 316 deposited along the sidewall 330 of the via 322 that can be achieved with the conventional PVD process is limited. Once the amount of phase-change material 316 deposited on the sidewall 330 saturates, as shown in FIG. 3, the thickness of the phase-change material on the sidewall 330 does not grow with additional deposition of the phase-change material. Meanwhile, the thickness of the phase-change material on the field region 331 surrounding the via 322 continues to grow forming a thick layer. This thick layer of phase-change material deposited on the field region 331 surrounding the via 322 poses a problem for the subsequent CMP process, as it introduces large film stress and phase-change material adhesion issues during CMP.

It is desirable to obtain a deposition process that can control the thickness of a material deposited on the sidewall of a via without introducing problems in the overall process flow.

DETAILED DESCRIPTION OF THE INVENTION

In the following detailed description, reference is made to certain embodiments of the invention. These embodiments are described with sufficient detail to enable those skilled in the art to practice them. It is to be understood that other embodiments may be employed, and that various structural, logical, and electrical changes may be made.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

Embodiments described herein provide a method of forming a material on a sidewall of a via which does not suffer from the potential drawbacks associated with conventional fabrication methods. The method involves combining a PVD process with a sputter etch process to deposit a material to any desired thickness along the sidewall of a via. With this method, the thickness of the material deposited along a sidewall is no longer limited by the arrival angle distribution and poor step coverage of the conventional PVD process. Further, the thickness of the material deposited on the sidewall is linearly dependent on the number of process cycles, thus providing good and desirable thickness control.

For purposes of further description, embodiments are described as forming a resistance variable material, e.g., a phase-change material, on the sidewalls of a via, but the invention has wider applicability to the formation of any material on a via sidewall.

Referring to FIGS. 4A-4H, one embodiment is now described with reference to the formation of a phase-change random access memory (RAM) element, wherein like reference numbers are used consistently for like features throughout the drawings. The embodiments described herein can be utilized for an array of memory elements, which can be formed simultaneously, or in parts of an integrated circuit not used as memory elements.

Figure 1A:
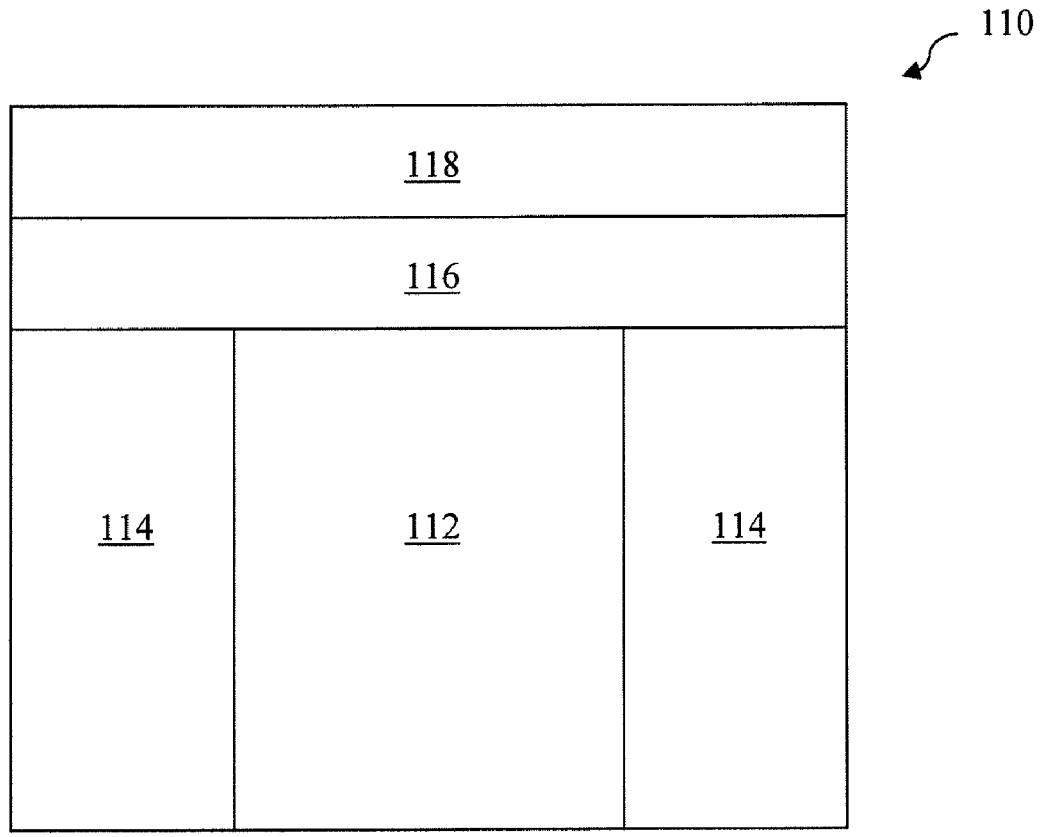
FIGS. 1A-1B are schematic views of a phase-change memory element.
Figure 1B:
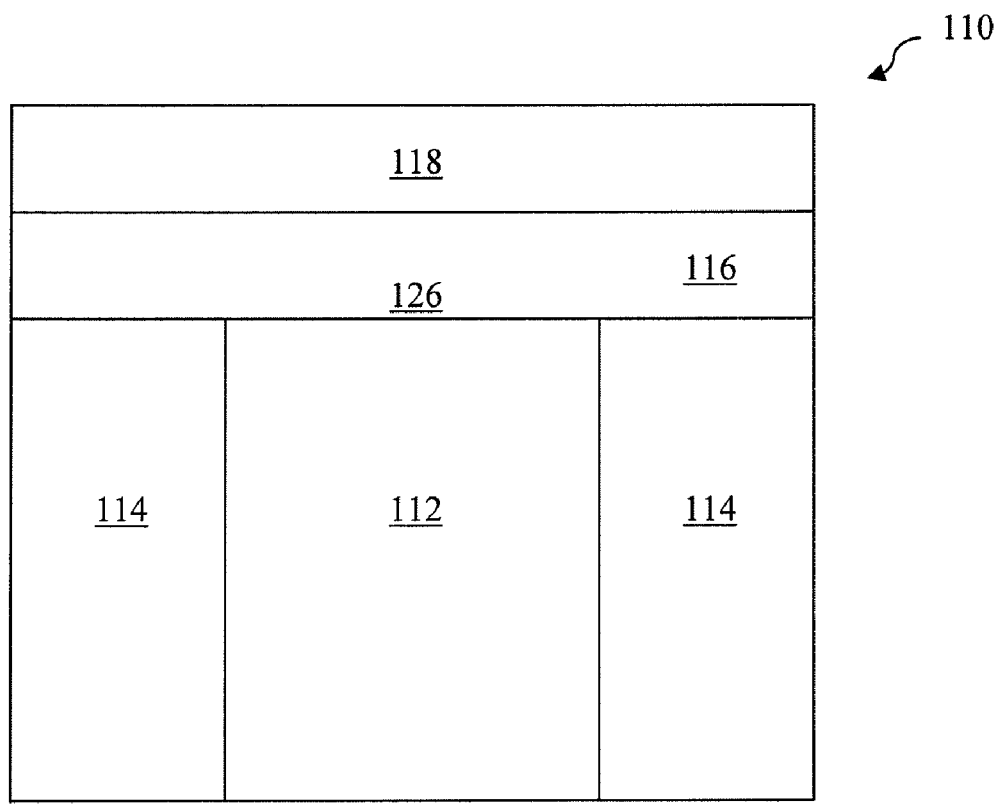
Figure 2A:
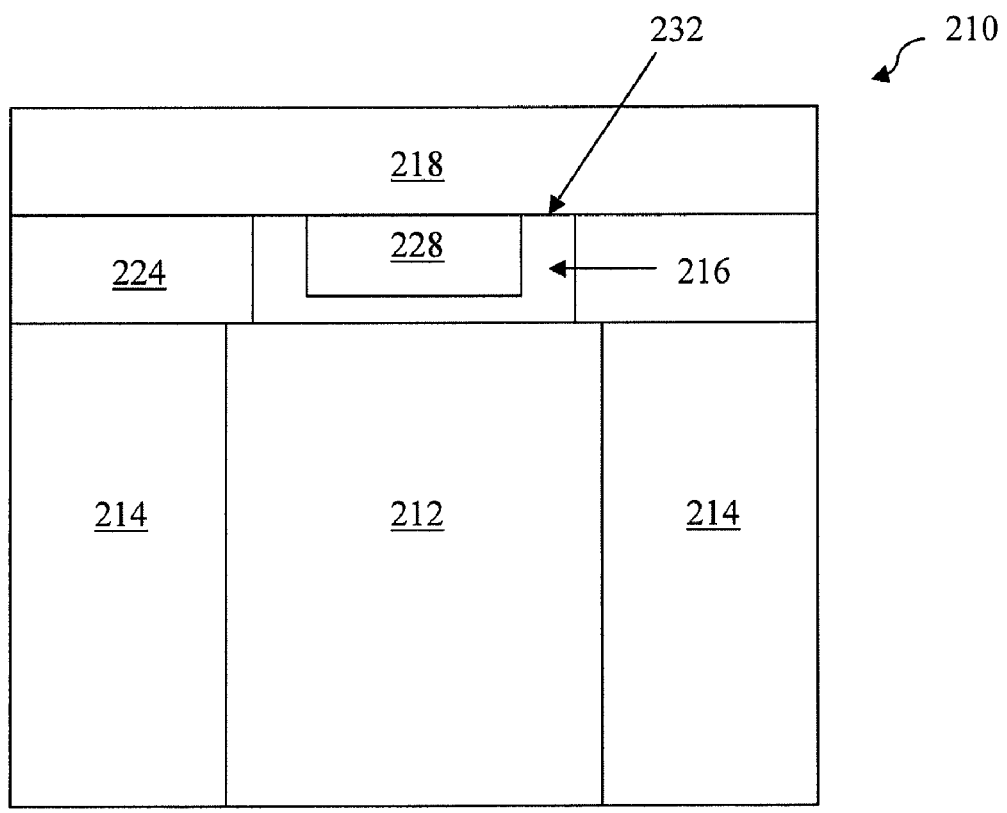
FIGS. 2A-2C are schematic views of another phase-change memory element and its intermediate stages of fabrication.
Figure 2B:
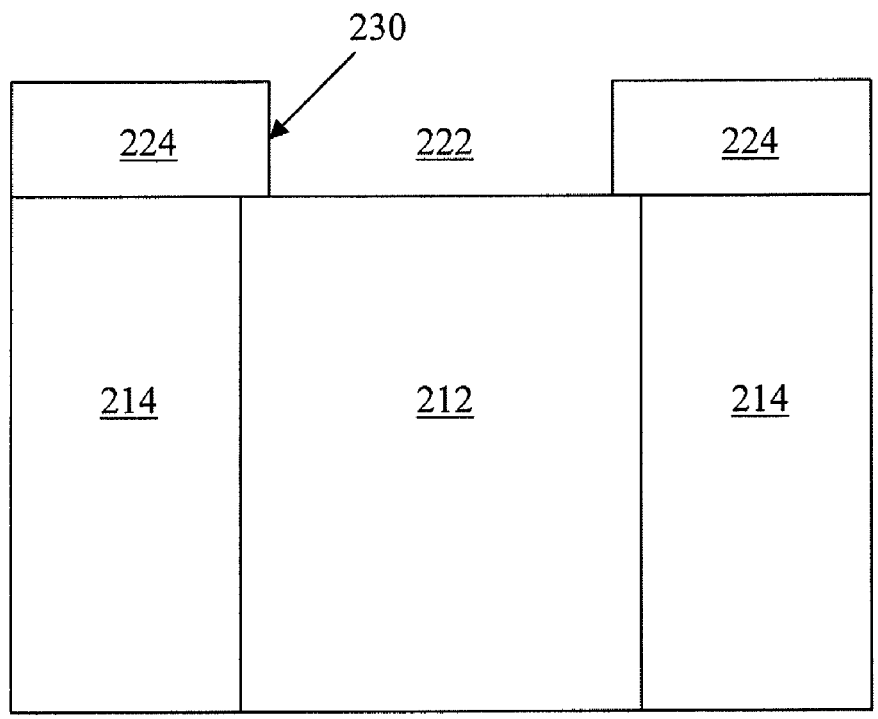
Figure 2C:
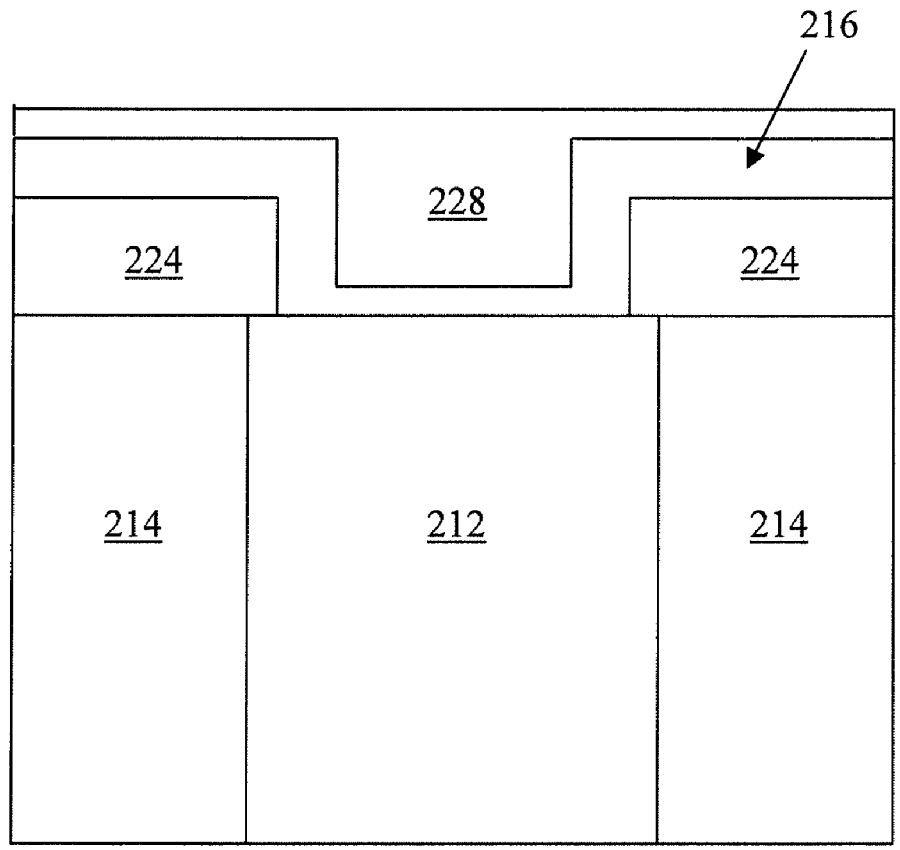
Figure 3:
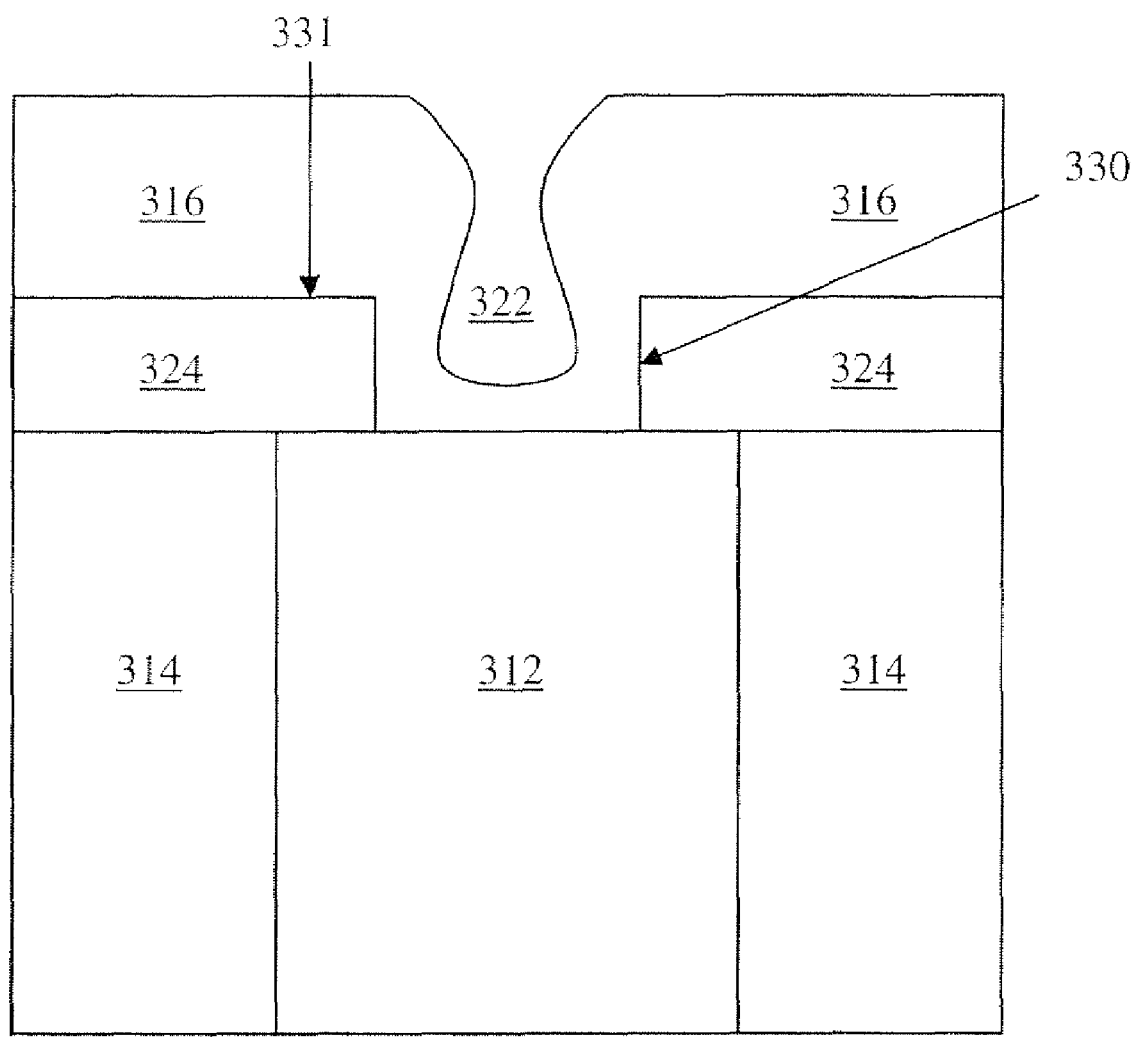
FIG. 3 is a schematic view of a phase-change memory element in its intermediate stage of fabrication illustrating potential drawbacks of the conventional deposition process.
Figure 4A:
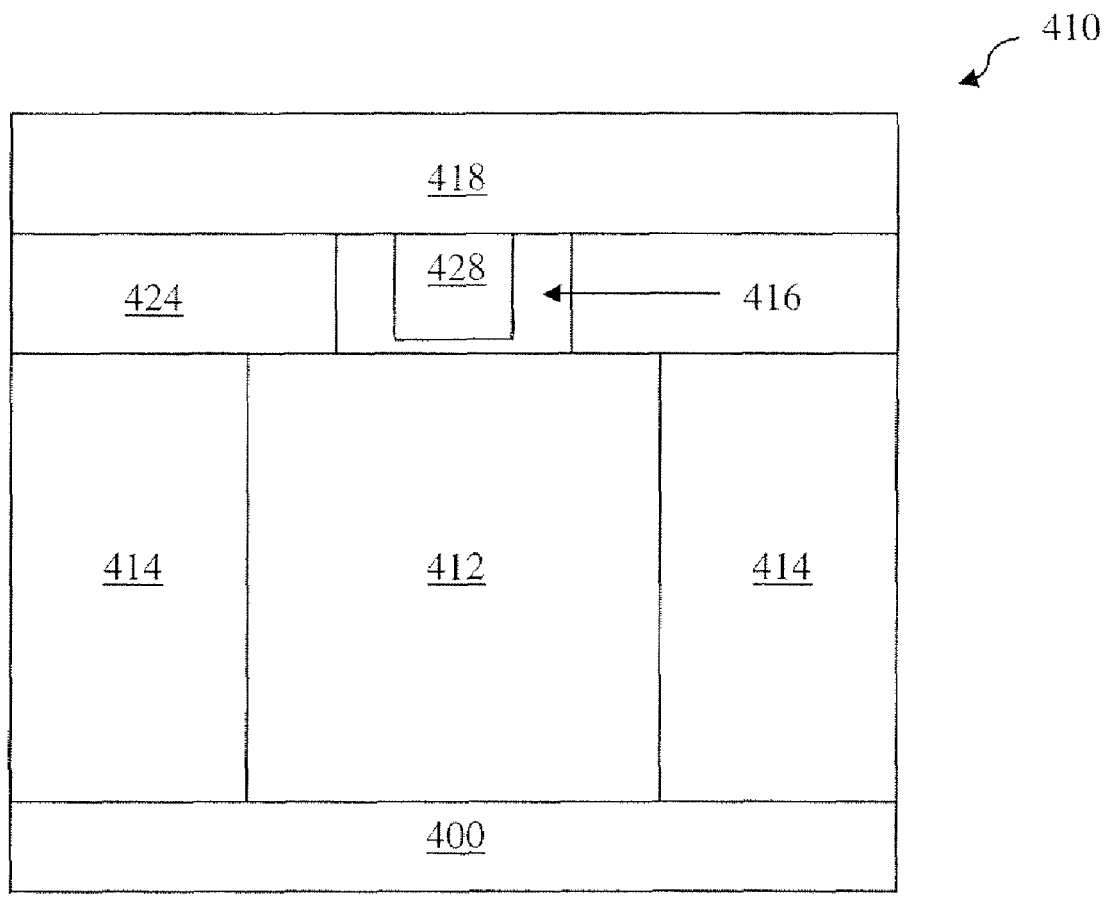
FIGS. 4A-4H are schematic views of the formation of a phase-change memory element in accordance with an embodiment described herein.
Figure 4B:
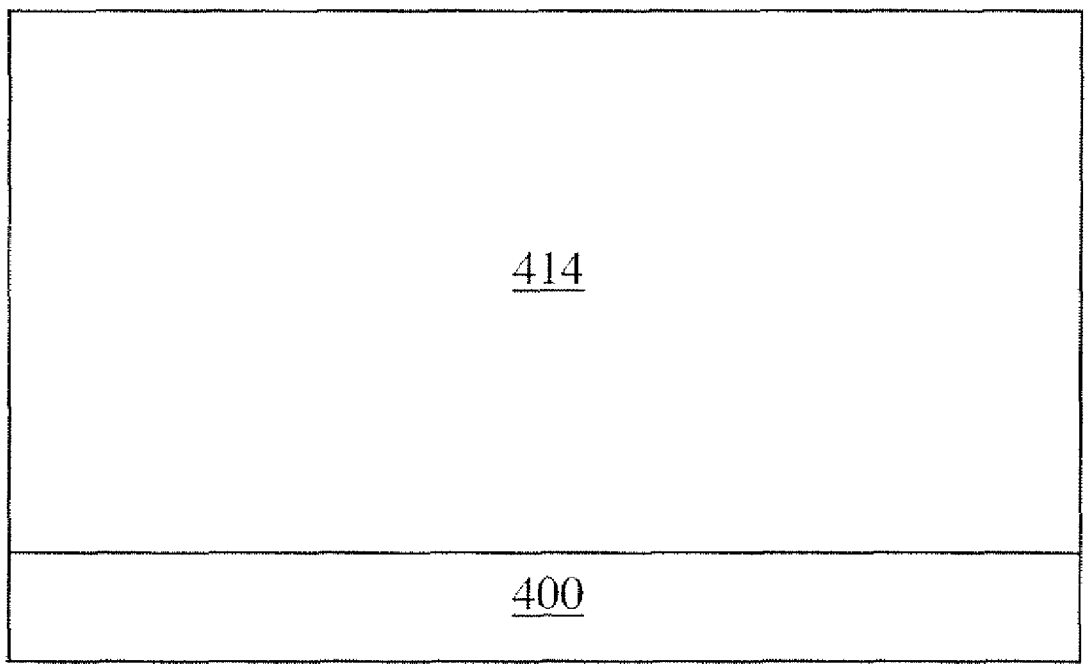

To form a phase-change memory element 410 shown in FIG. 4A, an intermediate phase-change memory element structure (FIG. 4B) is first formed by, for example, depositing a first insulating layer 414 over a support substrate 400. The first insulating layer 414 can be formed of any insulating material, such as nitrides, oxides, high temperature polymers, low dielectric constant materials, insulating glass, and insulating polymers, among others.

Figure 4C:
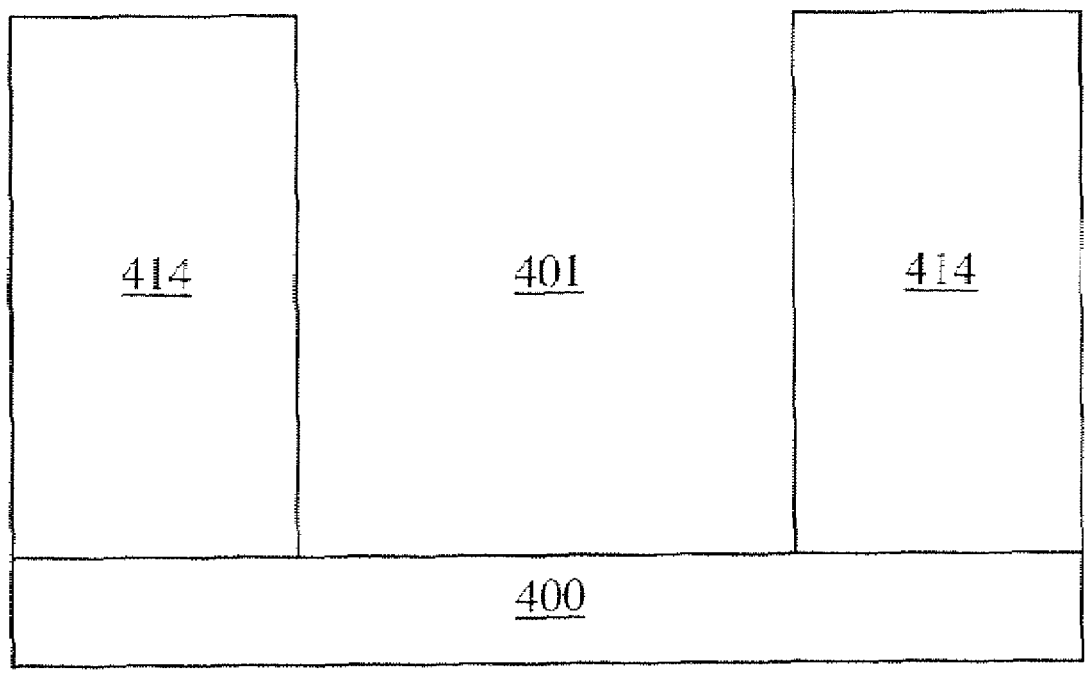
Figure 4D:
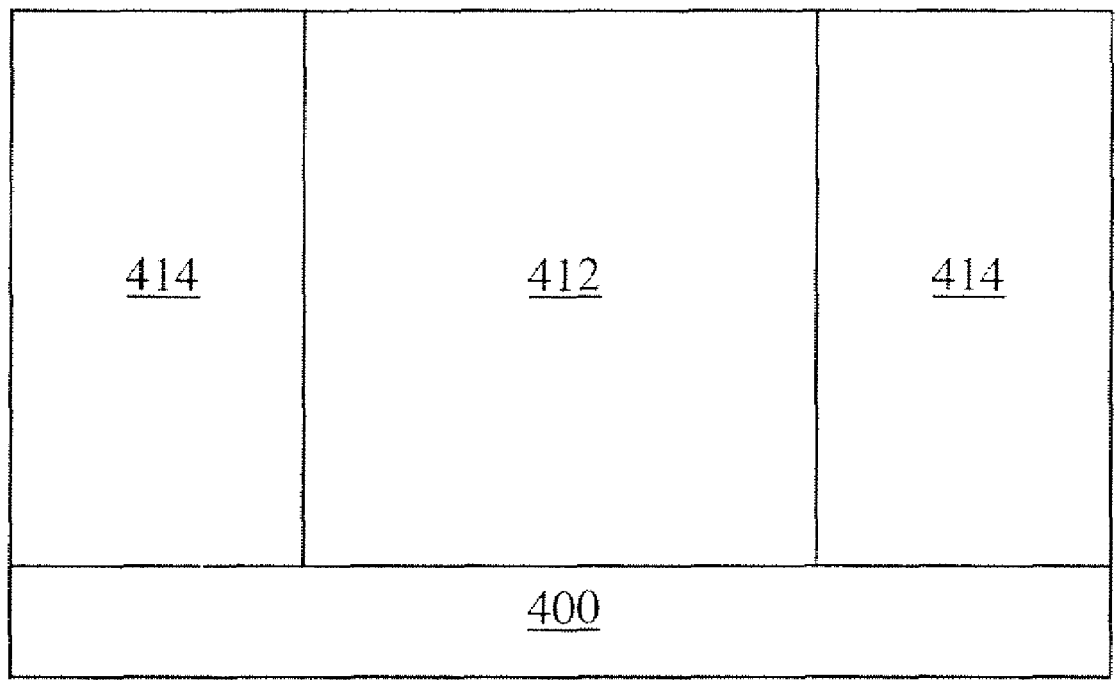
Figure 4E:
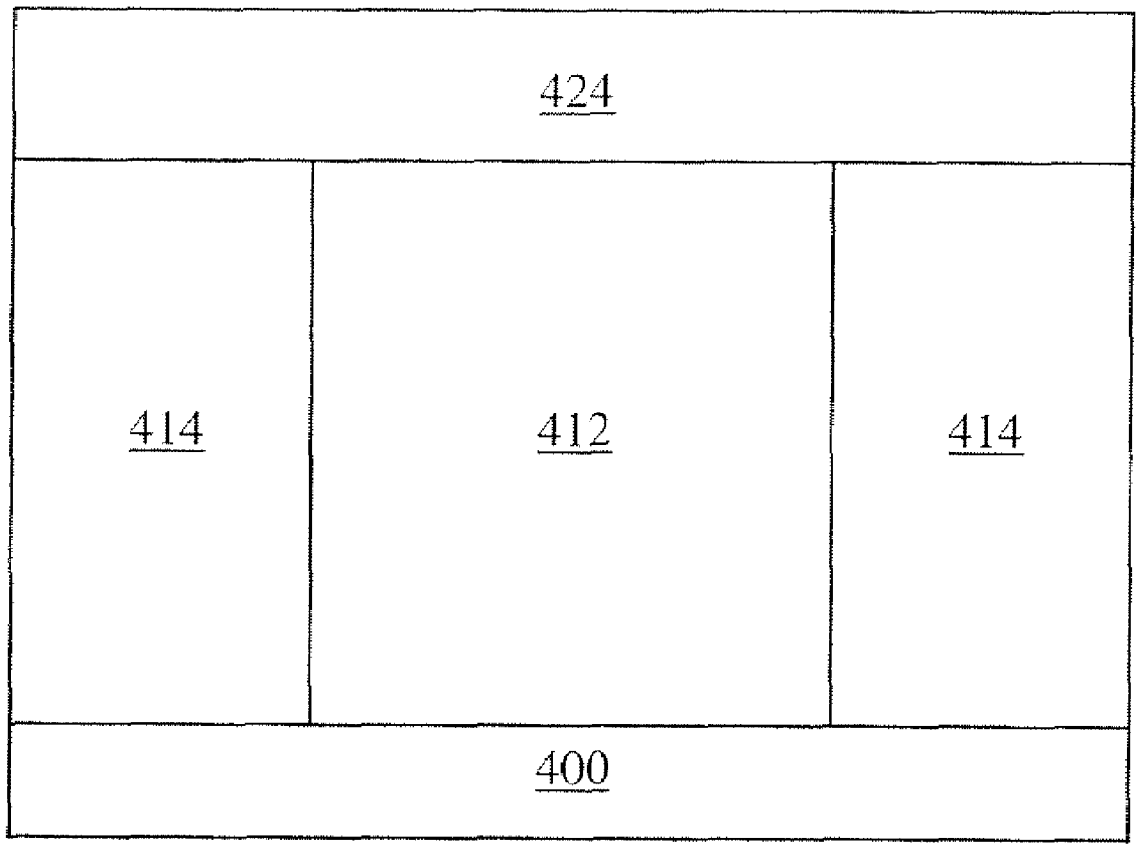

As shown in FIGS. 4C-4D, the first insulating layer 414 is etched to create a via 401 within which a first electrode 412 is formed. The first electrode 412 can be formed of any suitable conductive material, such as titanium nitride (TiN), titanium aluminum nitride (TiAlN), titanium tungsten (TiW), platinum (Pt) or tungsten (W), among others. Subsequently, as shown in FIG. 4E, a second insulating layer 424 is formed over the first insulating layer 414 and the first electrode 412. The second insulating layer 424 can be formed of any insulating material, such as nitrides, oxides, high temperature polymers, low dielectric constant materials, insulating glass, or insulating polymers, and may be formed by any method known in the art.

Figure 4F:
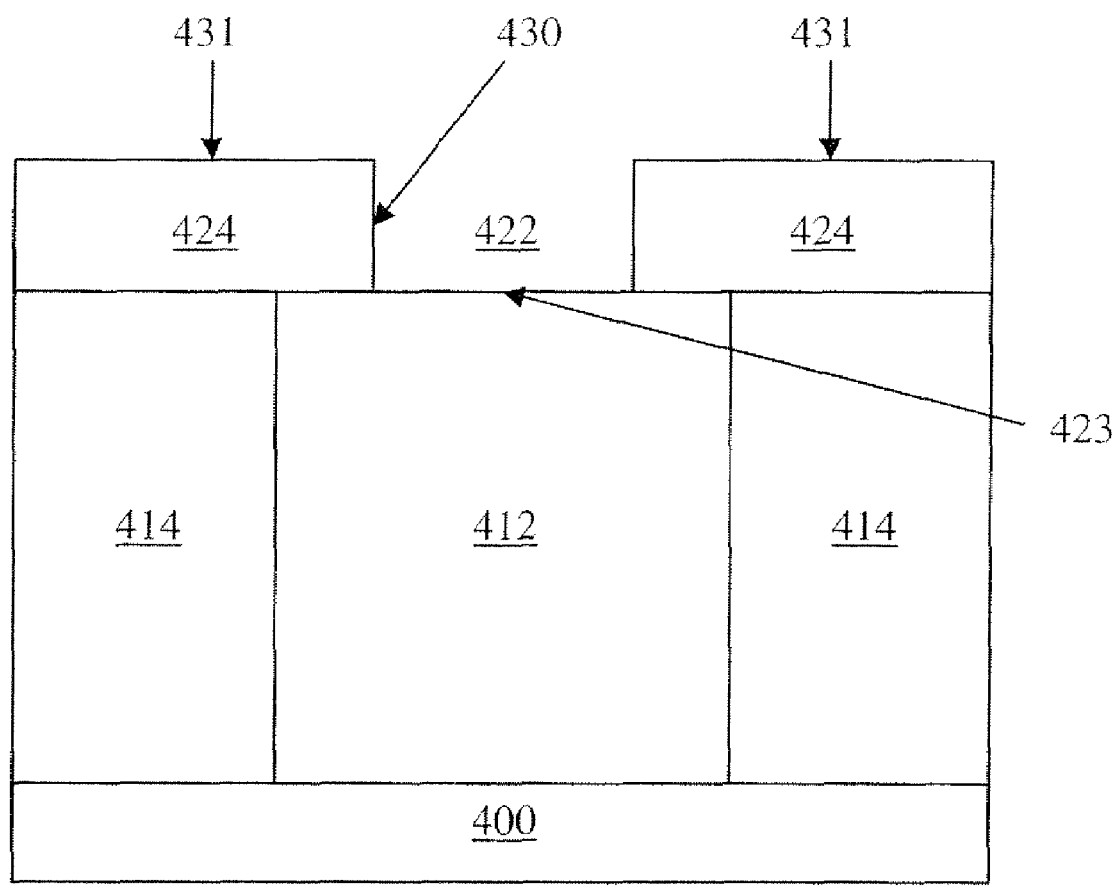

Referring now to FIG. 4F, a via 422 is formed in the second insulating layer 424 using methods known in the art, such as photolithographic and etching techniques, to expose a portion of the first electrode 412. Optionally, the via 422 can extend partially through the first electrode 412. The via 422 includes sidewalls 430 and a bottom surface 423. Preferably, the bottom surface 423 is a generally horizontal surface from which the sidewalls 430 extend. The sidewalls 430 may be substantially orthogonal to the bottom surface 423, as shown in FIG. 4F, or they may be of another desired angle or shape. Moreover, the via 422 can be of any shape suitable to the needs of the skilled artisan, including a generally cylindrical shape. Although the embodiment is described in terms of forming a via, it can be appreciated that any type of opening including, but not limited to, other apertures, trenches, and contact holes may be formed, as appropriate for the application.

Figure 4G:
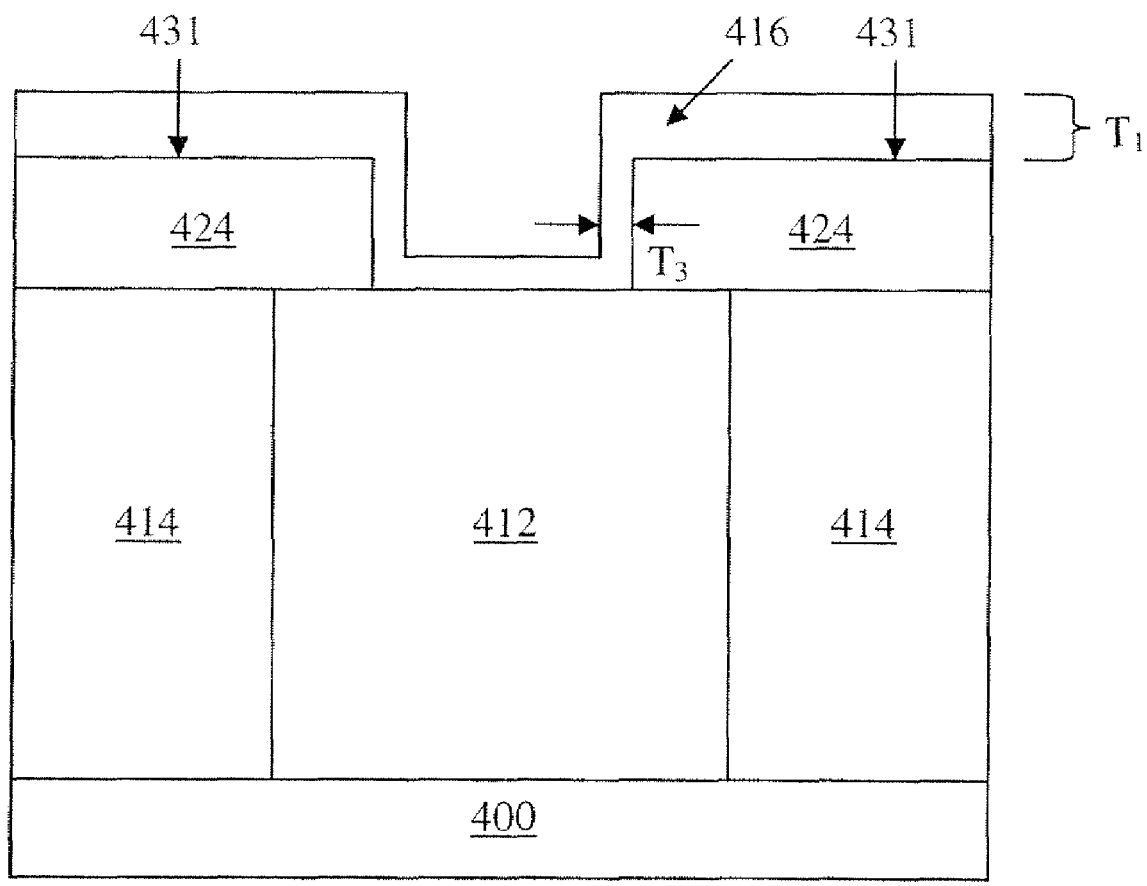
Figure 5A:
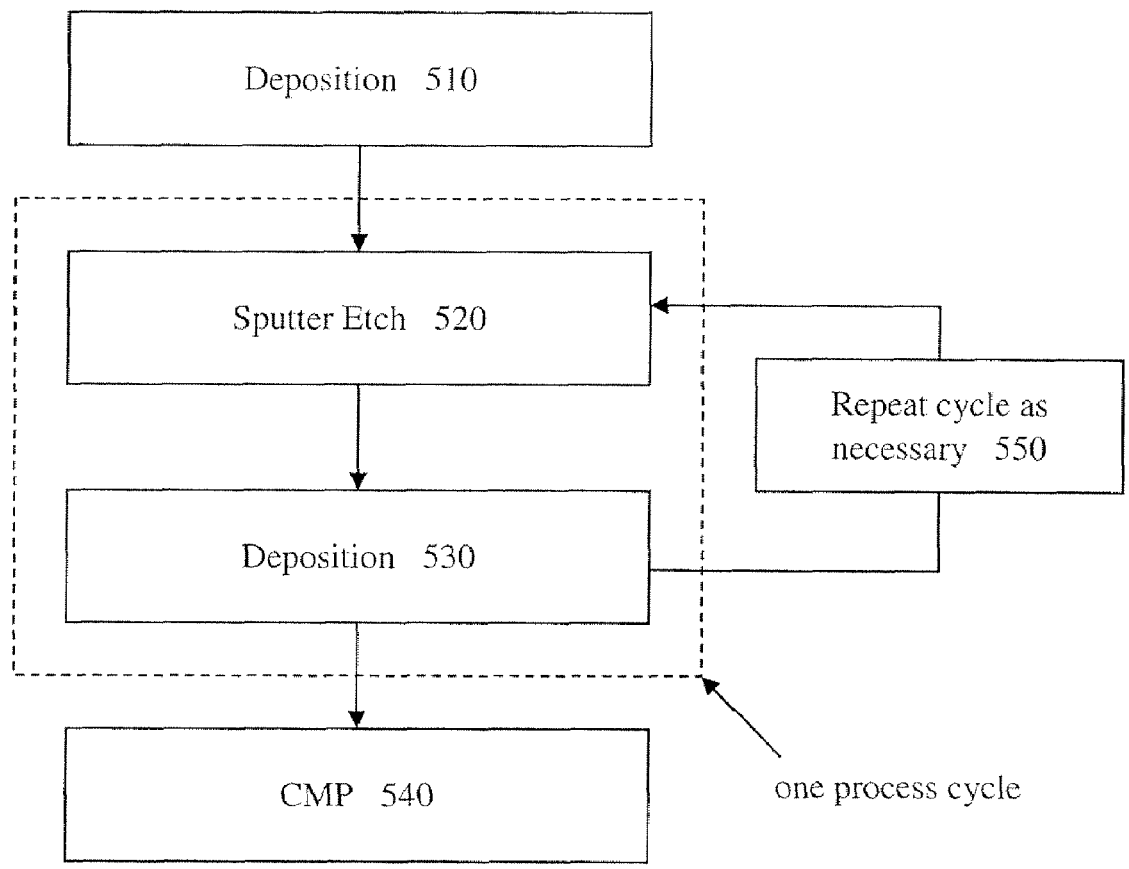
FIGS. 5A and 5B illustrate methods of forming a phase-change memory element in accordance with embodiments described herein.

FIG. 5A shows a process for forming a layer of phase-change material in the via 422. Once the via 422 is formed, a layer of phase-change material 416 is formed on the field region 431 of the second insulating layer 424 and within the via 422 (step 510) as shown in FIG. 4G. Preferably, the phase-change material 416 is formed by physical vapor deposition (PVD), direct current (DC) sputter deposition or radio frequency (RF) sputter deposition. More preferably, the phase-change material 416 is formed by a PVD process with good sidewall coverage and uniformity. The maximum thickness $T_1$ of the phase-change material 416 initially deposited on the field region 431 to start the process cycle depends on the size of the via 422. For example, the maximum sidewall thickness $T_3$ achieved during the initial deposition (step 510) should be less than about 200 Å for a via 422 having a diameter of 1600 Å. This is equivalent to depositing enough phase-change material such that the thickness of the layer formed on a sidewall 430 is less than about 20% of the diameter of the via 422. More preferably, the maximum thickness $T_3$ should be less than about 150 Å for a via 422 having a diameter of 1600 Å. The deposited phase-change material 416 is preferably a chalcogenide alloy derived from the Ge—Te—Sb ternary system. Other exemplary phase-change materials may also include, for example, $Ge_xTe_y$, GaSb, $Sb_{x^-}Te_y$, InSb, InSe, $In_xSb_yTe_z$, $Sn_xSb_yTe_z$, $Ga_xSe_yTe_z$, InSbGe, AgInSbTe, GeSnSbTe, $Te_xGe_ySb_zS_k$, and GeSbSeTe.

Figure 4H:
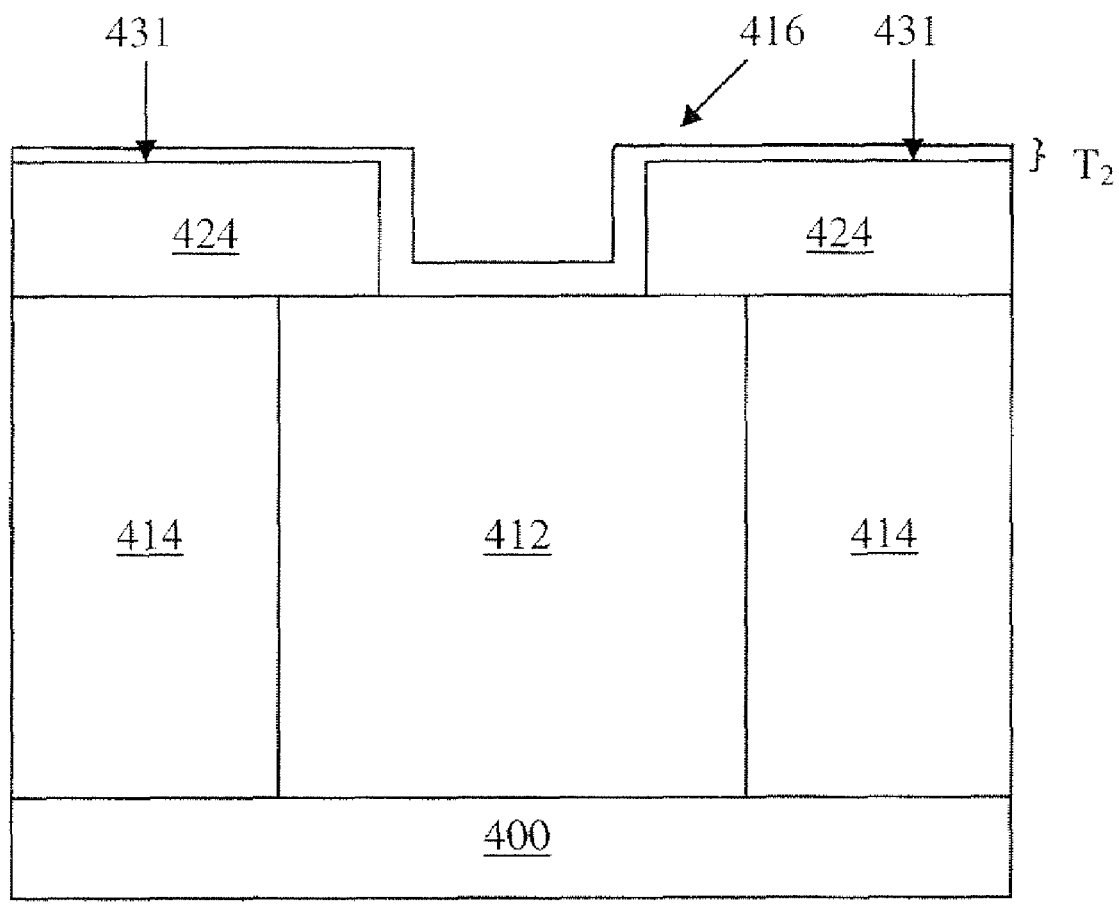

Next, at step 520, a substantial portion of the phase-change material 416 deposited on the field region 431 of the second insulator 424 is removed, preferably by a sputter etch process such as argon plasma sputtering. As FIG. 4H illustrates, the sputter etch process reduces the overall thickness $T_2$ of the phase-change material 416 deposited on the field region 431, but minimally affects the thickness of the phase-change material 416 deposited on the sidewall 430 of the via 422. The sputter etch process can be conducted with an inert gas, typically argon, to modify the shape of the via and to improve subsequent phase-change material deposition processes.

As shown in FIG. 5A, one process cycle is completed by depositing another layer of the phase-change material within the via 422 of FIG. 4H (step 530). Preferably, the deposition process of step 530 is the same as the deposition process of step 510. As FIG. 5A further illustrates, the process cycle can be repeated as necessary (step 550). The amount of phase-change material deposited and removed in each process cycle need not be the same and may vary from cycle to cycle. One advantage of combining the deposition process with the sputter etch process is that both processes can be conducted in the same chamber. Therefore, multiple process cycles are possible without creating complications to the overall process flow. Moreover, by combining the deposition process with the sputter etch process, the sidewall thickness is no longer limited by the arrival angle distribution and poor step coverage of the conventional deposition process.

Figure 5B:
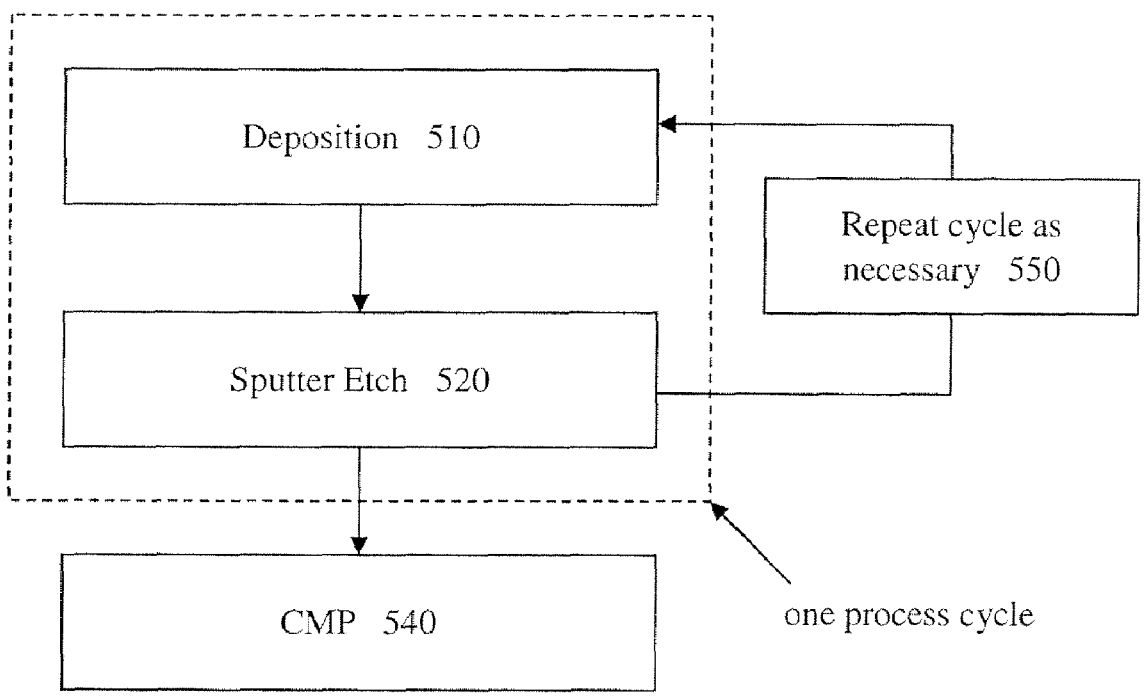

In another embodiment shown in FIG. 5B, one process cycle is completed by conducting the sputter etch process (step 520) after the deposition of phase-change material (step 510). Similar to FIG. 5A, the process cycle can be repeated as necessary (step 550). The difference between FIG. 5A and FIG. 5B is that in FIG. 5A, one process cycle ends with the deposition process (step 530) while in FIG. 5B, one process cycle ends with the sputter etch process (step 520). Moreover, the embodiments shown in FIG. 5A and FIG. 5B are not limited to conducting a CMP process after repeating a number of process cycles (step 550). In fact, various processes may follow after repeating the process cycles as necessary (step 550), but before conducting the CMP process (step 540). One such process may be filling the via 422 with an insulating material 428 (shown in FIG. 4A), such as nitrides, oxides, high temperature polymers, low dielectric constant materials, insulating glass, and insulating polymers. Preferably, an oxide material is deposited by chemical vapor deposition (CVD) or atomic layer deposition (ALD) to fill the via 422.

Figure 6:
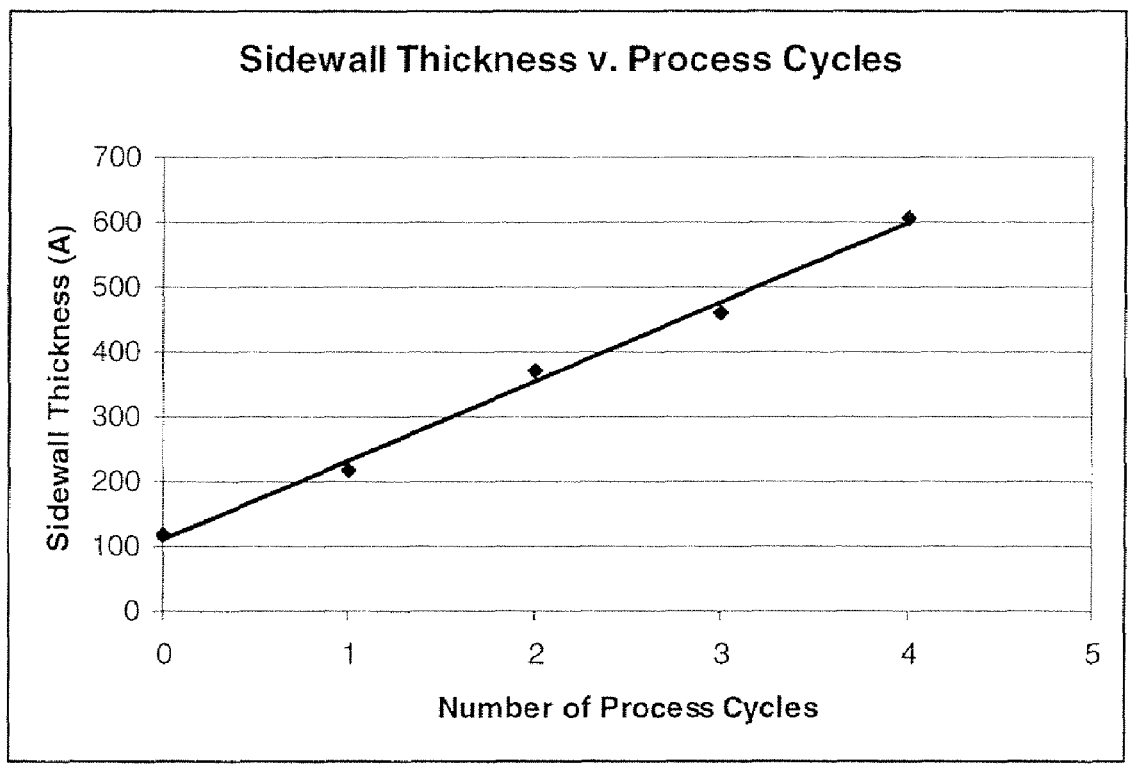
FIG. 6 is a graphical representation illustrating the linear relationship between the number of process cycles and the thickness of the phase-change material deposited on a sidewall of a via.

Conducting each additional process cycle correspondingly increases the thickness of the phase-change material deposited on the sidewalls of the via. As illustrated in FIG. 6, the thickness of the phase-change material deposited on a sidewall of a via increases linearly with the number of process cycles performed. This linear relationship provides a mechanism for effectively controlling the sidewall thickness. The diameter of the via used to generate the data in FIG. 6 was 1600 Å.

Figure 7:
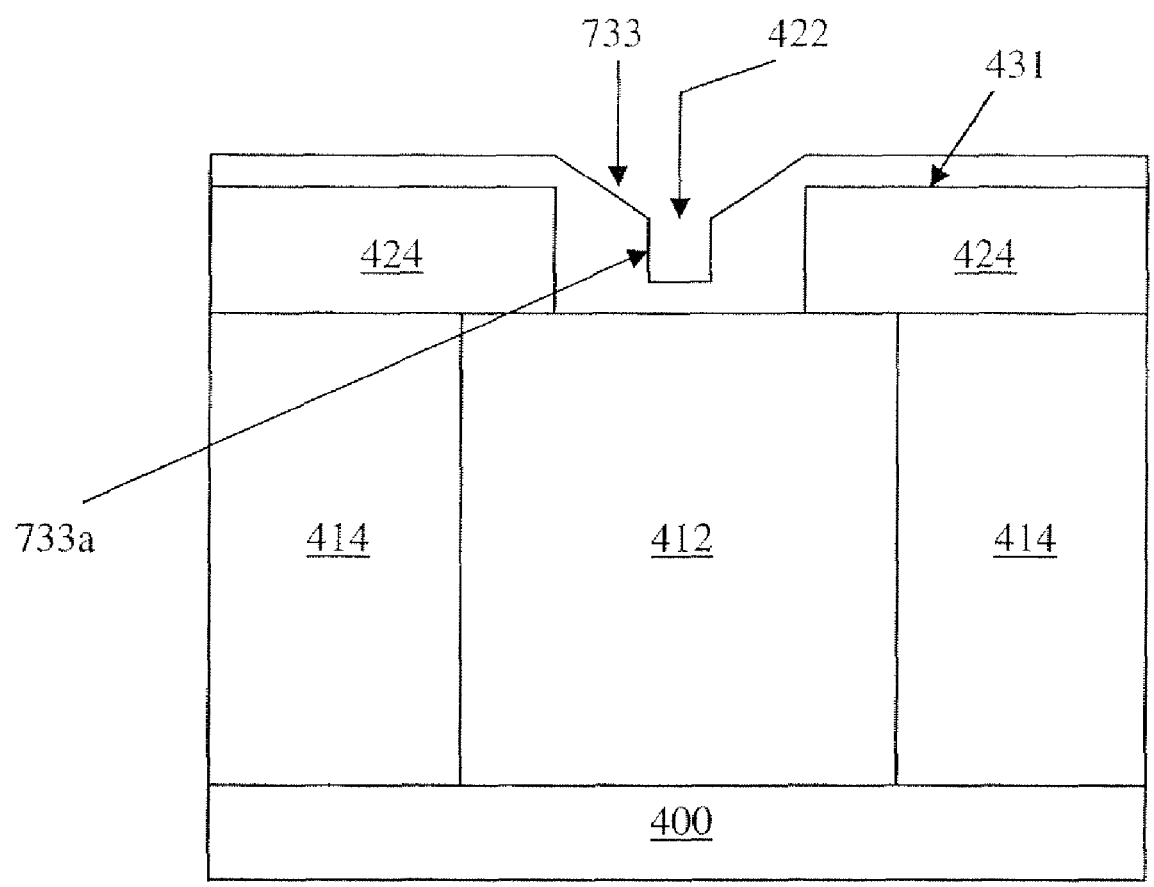
FIG. 7 illustrates the formation of a funnel shaped opening after performing multiple process cycles in accordance with an embodiment described herein.

As FIG. 7 illustrates, additional process cycles can produce a funnel shaped opening 733 at the top of the via 422. However, the sidewall profile 733a is relatively vertical at the lower half of the via 422. A subsequent CMP process (step 540) can be performed on the via, removing the funnel shaped opening 733 at the top of the via 422, while leaving the fairly vertical lower half 733a of the via 422 untouched, to produce a uniform switching region for the phase-change material. Since the sputter etch process of each process cycle reduces the thickness of the phase-change material on the field region 431 surrounding the via, subsequent CMP process can be performed without substantially deforming the phase-change material deposited in the via. After filling the via 422 with an insulating material 428 (shown in FIG. 4A) and conducting the CMP process, a top electrode 418 is then formed to produce the structure illustrated in FIG. 4A.

The above description and drawings are only to be considered illustrative of specific embodiments, which achieve the features and advantages described herein. Modification and substitutions to specific process conditions and structures can be made. Accordingly, the embodiments of the invention are not to be considered as being limited by the foregoing description and drawings, but is only limited by the scope of the appended claims.

What is claimed is:

1. A method of forming a phase-change material memory element, the method comprising:
   forming a first phase-change material along at least a sidewall of an opening and partially filling the opening within a portion of a material and on a region of the material surrounding the opening;
   performing at least one process cycle, wherein the process cycle comprises:
      removing a portion of the first phase-change material from at least the region surrounding the opening, and
      forming a second phase-change material over the existing phase-change material within the opening and partially filling the opening, wherein the process cycle leaves a space within the phase-change material; and
   filling the space with an insulating material after repeating at least one process cycle.

2. The method of claim 1, wherein the opening comprises a via.

3. The method of claim 1, wherein the opening comprises a trench.

4. The method of claim 1, wherein the first and second phase-change materials comprise a chalcogenide material.

5. The method of claim 1, wherein forming the first or second phase-change material comprises conducting a physical vapor deposition process.

6. The method of claim 1, wherein forming the first or second phase-change material comprises conducting a DC sputter deposition process.

7. The method of claim 1, wherein forming the first or second phase-change material comprises conducting a RF sputter deposition process.

8. The method of claim 1, wherein the opening is cylindrical and a thickness of the first phase-change material formed along the sidewall of the opening before performing at least one process cycle is less than about 20% of a diameter of the opening.

9. The method of claim 1, wherein removing a portion of the first phase-change material comprises conducting a sputter etch process.

10. The method of claim 1, further comprising conducting a CMP process after repeating at least one process cycle.

11. The method of claim 10, wherein the CMP process removes the first and second phase-change materials from at least the region surrounding the opening to expose the first and second phase-change materials deposited along the sidewall of the opening.

12. The method of claim 1, further comprising conducting multiple process cycles.

13. A method of forming a memory element, the method comprising:
   depositing a first resistance variable material on at least a sidewall of an opening and partially filling the opening formed in a portion of a material and on a region surrounding the opening and on a first electrode at a bottom of the opening;
   performing at least one process cycle, wherein the process cycle comprises:
      removing a portion of the first resistance variable material from at least the region surrounding the opening, and
      depositing a second resistance variable material at least over the existing resistance variable material within the opening and on the sidewall and partially filling the opening, wherein the process cycle leaves a space within the resistance variable material;

filling the space with an insulating material after repeating at least one process cycle;

planarizing an upper portion of the opening; and forming a second electrode over and in contact with the resistance variable material.

14. The method of claim 13, wherein the first and second resistance variable materials comprise a chalcogenide material.

15. The method of claim 13, wherein depositing the first or second resistance variable material comprises conducting a physical vapor deposition process.

16. The method of claim 13, wherein removing a portion of the first or second resistance variable material comprises conducting a sputter etch process.

17. The method of claim 13, wherein the opening is cylindrical.

18. The method of claim 17, wherein a thickness of the first resistance variable material deposited on the sidewall of the opening before performing at least one process cycle is less than about 20% of a diameter of the opening.

19. The method of claim 13, wherein planarizing comprises conducting a CMP process.

20. The method of claim 13, wherein the CMP process removes the first and second resistance variable materials from at least the region surrounding the opening to expose the first and second resistance variable materials deposited on the sidewall of the opening.

21. The method of claim 13, further comprising conducting multiple process cycles.

22. A method of forming a layer of material in an opening of a material layer, the method comprising:

forming the layer of material along at least a sidewall of the opening and partially filling the opening formed in the material layer and on a region surrounding the opening;

performing at least one process cycle, wherein the process cycle comprises:

removing a portion of the material from at least the region surrounding the opening, and forming another layer of material over the existing layer of material within the opening and partially filling the opening, wherein the process cycle leaves a space within the material; and filling the space with an insulating material after repeating at least one process cycle.

23. The method of claim 22, wherein the opening comprises a via.

24. The method of claim 22, wherein the opening comprises a trench.

25. The method of claim 22, wherein the material comprises a resistance variable material.

26. The method of claim 25, wherein the resistance variable material comprises a chalcogenide material.

27. The method of claim 22, wherein forming the layer of material comprises conducting a physical vapor deposition process.

28. The method of claim 22, wherein forming the layer of material comprises conducting a DC sputter deposition process.

29. The method of claim 22, wherein forming the layer of material comprises conducting a RF sputter deposition process.

30. The method of claim 22, wherein a thickness of the layer of material formed on the sidewall of the opening before performing at least one process cycle is less than about 20% of a diameter of the opening.

31. The method of claim 22, wherein removing a portion of the material comprises conducting a sputter etch process.

32. The method of claim 22, further comprising conducting a CMP process after repeating at least one process cycle.

33. The method of claim 32, wherein the CMP process removes the material from at least the region surrounding the opening to expose the material deposited on the sidewall of the opening.

34. The method of claim 22, further comprising conducting multiple process cycles.

35. A method of depositing a phase-change material in a via, the method comprising:

depositing a first phase-change material on at least a sidewall of the via and partially filling the via formed in the material layer and on a region surrounding the via;

performing at least one process cycle, wherein the process cycle comprises:

sputter etching a portion of the phase-change material from at least the region surrounding the via, and depositing a second phase-change material at least over the existing phase-change material within the via and on the sidewall and partially filling the via, wherein the process cycle leaves a space within the phase-change material;

filling the space with an insulating material after repeating at least one process cycle; and planarizing an upper portion of the via.

36. The method of claim 35, wherein the first and second phase-change materials comprise a chalcogenide material.

37. The method of claim 35, wherein depositing the first or second phase-change material comprises conducting a physical vapor deposition process.

38. The method of claim 35, wherein depositing the first or second phase-change material comprises conducting a DC sputter deposition process.

39. The method of claim 35, wherein depositing the first or second phase-change material comprises conducting a RF sputter deposition process.

40. The method of claim 35, wherein a thickness of the first phase-change material deposited on the sidewall of the via before performing at least one process cycle is less than about 20% of a diameter of the via.

41. The method of claim 35, further comprising conducting a CMP process after repeating at least one process cycle.

42. The method of claim 41, wherein the CMP process removes the first and second phase-change materials from at least the region surrounding the via to expose the first and second phase-change materials deposited on the sidewall of the via.

43. The method of claim 35, further comprising conducting multiple process cycles.

* * * * *